(12) United States Patent
Ying et al.

(10) Patent No.: US 6,300,252 B1
(45) Date of Patent: Oct. 9, 2001

(54) METHOD FOR ETCHING FUSE WINDOWS IN IC DEVICES AND DEVICES MADE

(75) Inventors: Shulan Ying; Shu-Chi Hung, both of Hsin-Chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/410,792

(22) Filed: Oct. 1, 1999

(51) Int. Cl.$^7$ ................................................ H01L 21/00
(52) U.S. Cl. ............................ 438/723; 216/67; 216/79; 257/635; 257/640; 257/665; 438/724; 438/738; 438/740
(58) Field of Search ................................ 438/723, 724, 438/737, 738, 740, 741, 743, 744; 216/67, 79; 257/635, 636, 637, 640, 642, 665

(56) References Cited

U.S. PATENT DOCUMENTS 5,989,784 * 11/1999 Lee et al. ..................... 438/738 X
6,162,722 * 12/2000 Hsu ............................... 438/738 X

* cited by examiner

Primary Examiner—William A. Powell
(74) Attorney, Agent, or Firm—Tung & Associates

(57) ABSTRACT

A method is provided for etching fuse windows through a passivation layer and at least two inter-metal dielectric layers that are deposited on top of a fuse when the fuse is embedded in an insulating material including a top layer of silicon nitride on a semi-conducting substrate. The method can be carried out by a two-step etching process in which an opening is first etched for the fuse window through a passivation layer by a first etchant that has low selectivity to the passivation material, and then the opening is etched through the IMD layers in a second etching process by a second etchant which has high selectivity to the silicon nitride etch-stop layer. The two-step etching process can be easily controlled so that the quality and yield for the resulting fuse windows can be improved.

20 Claims, 2 Drawing Sheets

METHOD FOR ETCHING FUSE WINDOWS IN IC DEVICES AND DEVICES MADE

FIELD OF THE INVENTION

The present invention generally relates to a method for opening fuse windows in semiconductor devices and more particularly, relates to a method for opening fuse windows in semiconductor devices by a two-step etching process in which a PE oxide and PE nitride layers are first etched away in a first etching step and then multiple layers of inter-metal dielectric materials are etched away in a second etching step which stops at a silicon nitride etch-stop layer.

BACKGROUND OF THE INVENTION

In the fabrication of integrated circuits, conductive fusible links (or fuses) are frequently used to repair any defects in the circuits. Integrated circuits that frequently utilize these conductive fusible links include memory devices such as dynamic random access memory devices (DRAM), static random access memory devices (SRAM) or logic devices. In one method, the conductive fusible links can be made non-conductive by blowing the fuse with the application of laser energy. The fuses are blown so that electrical circuits can be rewired to replace defective devices with redundant circuits. The process of blowing the fuses by the application of laser energy is known as a laser trimming process.

For instance, in a DRAM or SRAM, defective memory cells in the array can be replaced by blowing the fuses associated with the defective cells and thus activating redundant circuits provided in a spare row or column of cells. The technique of using conductive fusible link to repair defective circuits greatly enhances the yield of semiconductor circuits and reduces overall fabrication costs.

Conductive fusible links are also used in logic circuits for repair or reconfiguration by blowing fuses. For instance, it is possible to fabricate a generic logic device which has a large number of interconnected logic gates and then, in a final processing step, the device is customized to perform a specific logic function by disconnecting the unnecessary logic elements by blowing the fuses that make the necessary connections.

The reliability of the fuse blowing technique is important if the yield of IC devices is to be increased. It is especially important when a large number of fuses must be successively blown to achieve a desirable circuit. Limiting factors in the successful blowing of fuses are the minimum laser energy required to blow the fuses and the accessability of the fuses through the fuse window openings provided on the integrated circuit chip. Since fuses are normally formed over thick field oxide regions in a semiconductor substrate for preventing shortening of the fuse to the substrate, the fuse must also be covered by layers of insulating materials to insulate from other conductive layers built on top of the semiconductor device. For instance, in a DRAM device, multiple-level metal conductors are normally used to provide electrical connections in the circuits. Each of the conductive metal layers is insulated by a dielectric material which also covers the fuse that was originally formed on the substrate.

A fuse can be formed of a metal, a polysilicon or a polycide. For instance, metals of aluminum, platinum silicide, titanium and tungsten are frequently used, so are polycides of titanium polycide, tungsten polycide or molybdenum polycide. The dielectric layers used in a memory device can be an insulating layer or a passivation layer formed of borophosphosilicate glass (BPSG), borosilicate glass (BSG), spin-on-glass (SOG), silicon oxide or silicon nitride.

In order to successfully blow a fuse, an opening over the fuse (or a fuse window opening) must be provided in the area where the fuse will be blown so that a laser beam can be effectively used to heat the fuse. For instance, an opening can be made which normally has a width of 4~7 microns and a length of 4~7 microns. Since a use is covered by layers of dielectric materials which impede the laser blowing process by reducing the energy level that actually reaches the fuse, the layers dielectric materials must be etched away or otherwise removed so that the fuse is substantially exposed. Alternatively, a thin layer of a dielectric material can be left on the fuse to protect it from contamination. For a fuse to successfully absorb heat from laser irradiation and thus be blown, the laser trimming process requires that only a very thin dielectric layer covers the fuse such that laser can readily penetrates the dielectric layer and melts the fuse. It is therefore an important aspect of the fuse blowing process that a fuse window must be properly opened through several insulating layers such as silicon nitride, silicon oxide, spin-on-glass and borophosphosilicate glass.

A typical fuse window opening process for a memory device is shown in FIGS. 1 and 2. Memory device 10 is built on a semiconductor substrate 12 which has a dielectric layer 14 formed thereon. The semiconductor substrate 12 can be suitably made of silicon and the dielectric layer can be typically a grown or deposited silicon dioxide. A conductive fusible link 16 is formed on the dielectric layer 14 by first depositing a conductive layer such as metal, polysilicon or polycide and then patterning it by known techniques in the art. The fusible link 16 can be a chosen target area of a metal runner that has the same geometry as the rest of the runner or alternatively, the fusible link 16 can be a portion of a runner that has reduced cross-sectional area for improved blowing or melting by laser irradiation. A fusible link of reduced thickness in the region of the fuse opening 22 may be desirable to maximize the laser melting efficiency.

On top of the fusible link 16, a dielectric layer 18 which is typically a flowable glass material such as BPSG is then deposited. The dielectric layer may also be suitably formed by spin-on-glass or deposited from tetraethoxysilane (TEOS), silane ($SiH_4$) or dichloiosilane ($SiCl_2H_2$) by a chemical vapor deposition technique. The dielectric layer 18 is known as a inter-level dielectric (ILD) layer. A first level metal conductor 24 is then formed on the ILD layer 18 by deposition and patterning. In a typical CMOS integrated circuit, the first level metal 16 may be formed of a thickness of approximately 5,000 Å with the ILD layer 18 formed of a phosphorus doped TEOS in a thickness of 6,000 Å over the fusible link 16.

After a third dielectric layer 26 is formed and planarized, a second metal layer 28 is deposited and patterned similarly as the first metal layer 24. A passivation layer 32 normally formed of a flowable glass material for ease of planarization is then deposited to insulate the second metal layer 28.

In the next step of fabrication of the fuse window opening 22, a thin photoresist layer 34 is deposited over the passivation layer 32 and then patterned by conventional lithographic techniques to expose a bond pad 30 and the fusible link 16. This is shown in FIG. 2. The etching process can be conducted by a dry etching technique of reactive ion etching. The photoresist layer 34 serves as an etch mask to prevent etching of the ILD layer 26 from regions adjacent to the fusible link 16. After the completion of the reactive ion etching process, the photoresist etch mask 34 is removed by a conventional method.

In a typical IC structure such as that shown in FIGS. 1 and 2, two or more metal layers 24, 28 ($M_1$, $M_2$, etc.) are fabricated on the die to provide patterns of conductive lines. The layers are separated by the dielectric layer 26. The ILD layer 26 normally overlies the $M_1$ layer 24, while the $M_2$ layer 28 overlies the ILD layer 26. A topmost passivation layer 32 is typically applied over the $M_2$ layer 28. Openings through the passivation layer 32, shown in FIG. 2, expose areas of the $M_2$ layer 28 as bond pads 30.

In modern memory devices, the technique of building multi-level metal interconnections is one of the limiting factors in down-sizing integrated circuits. By using more than two metal level, i.e., three or four levels of metal conductors in a memory device, the average interconnect length and consequently the die size can be reduced. The use of a multi-level metal conductor system can reduce lead resistance and capacitance without compromising yield and reliability. For instance, after patterning a second level of metal conductors, another inter-level dielectric layer can be deposited and planarized, which is followed by via and third metal conductor patterning, and another ILD layer deposition and a fourth metal deposition and patterning. It is recognized that since upper level metal interconnects have generally longer average lengths than lower level interconnects (such as the gate interconnects), the upper level interconnects should utilize a metal that has lower resistivity such as aluminum, while tungsten should be used for the lower level metal conductors for its thermal and process stability.

In modern memory devices where more than three levels of metal conductors and consequently, more than three levels of inter-metal dielectric (IMD) layers are used, the task of opening fuse windows becomes more difficult. The total thickness for three or four IMD layers deposited on a memory device may be in the range between about 40,000 Å and 60,000 Å with an average value of 50,000 Å. The use of a single mask to form the fuse window openings in a single etching process becomes extremely difficult. An obvious solution to this processing difficulty is to use a thick photoresist layer on top of the passivation layer of PE oxide or PE nitride prior to imaging and etching for the fuse window openings. A thick photoresist layer can withstand a long etching process required for etching through three or four IMD layers without damaging the top metal conductor layer used for forming the bonding pads. The oxide thickness left on the polyfuse should be within a certain thickness range to obtain an effective laser repair yield when a fixed laser energy is used. If the thickness on top of the polyfuse is not sufficiently uniform during a fixed laser energy repair process, some polyfuse may be blown out while some other polyfuse may still have oxide left on top. As a result, after the repair, some area of the substrate may have been damaged due to the polyfuse on top, while some polyfuse may still have oxide left on the poly fuse due to the thicker oxide layer on the polyfuse.

It is therefore an object of the present invention to provide a method for opening fuse windows through thick IMD layers that does not have the drawbacks and shortcomings of the conventional dry etching methods.

It is another object of the present invention to provide a method for opening fuse windows on semiconductor devices that can be used to effectively open windows through more than two layers of inter-metal dielectric materials deposited on top of a fuse.

It is a further object of the present invention to provide a method for opening fuse windows on semiconductor devices by using a two-step etching process and a silicon nitride etch-stop layer.

It is another further object of the present invention to provide a method for opening fuse windows on semiconductor devices by first etching through a PE oxide and a PE nitride passivation layer in a first etching step and then etching through multiple inter-metal dielectric layers in a second etching step.

It is still another object of the present invention to provide a method for opening fuse windows on semiconductor devices in a two-step etching process in which an etchant which has low selectivity to a passivation layer is used in a first etching process and then an etchant which has high selectivity to silicon nitride is used in a second etching process.

It is yet another object of the present invention to provide a method for opening fuse windows on memory devices by using an etchant of $CF_4/CHF_3/SF_6$ in a first etching step and an etchant of $C_2F_6$ in a second etching step.

It is still another further object of the present invention to provide a semiconductor device that has a fuse window opened through a multiple member of inter-metal dielectric layers which stops at a silicon nitride etch-stop layer in a two-step etching process.

SUMMARY OF THE INVENTION

In accordance with the present invention, a method for opening fuse windows on semiconductor devices which utilizes a two-step etching process wherein a first etching step is carried out by an etchant which has a low selectivity to a passivation layer and a second etching step is carried out by an etchant which has a high selectivity to an etch-stop layer of silicon nitride is provided.

In a preferred embodiment, a method for etching fuse windows through a passivation layer and at least two inter-metal dielectric (IMD) layers deposited on top of a fuse wherein the fuse is embedded in an insulating material including a top layer of silicon nitride on a semi-conducting substrate can be carried out by first etching an opening for the fuse window through the passivation layer in a first etching process by a first etchant which has low selectivity to the passivation layer and then etching the opening through the IMD layers in a second etching process by a second etchant which has high selectivity to the etch-stop layer of silicon nitride.

In another preferred embodiment, a method for forming fuse windows through inter-metal dielectric (IMD) layers that are deposited on top of a fuse can be carried out by the operating steps of first providing a fuse on a semi-conducting substrate, then depositing and planarizing an inter-layer dielectric (ILD) layers on top of the fuse, then depositing a layer of silicon nitride on top of the ILD layer, then forming at least two layers of metal conductors on top of the silicon nitride layer, each of the at least two metal conductor layers has a corresponding IMD layer deposited on top, then depositing a passivation layer which has at least one insulating material on top of the IMD layers, then etching an opening for the fuse window through the passivation layer in a first etching process utilizing a first etch chemistry that has low selectivity to the at least one insulating material and then etching the opening through the IMD layers in a second etching process utilizing a second etch chemistry that has high selectivity to silicon nitride so that the etching process stops at the silicon nitride layer.

The present invention is further directed to an integrated circuit device that includes a fuse formed on a semi-conducting substrate, an inter-layer dielectric (ILD) layer insulating the fuse, a silicon nitride etch-stop layer deposited on top of the ILD layer, at least two inter-metal dielectric (IMD) layers deposited on top of the silicon nitride layer, and a fuse window opened in the IMD layers exposing at least partially the fuse covered by the ILD and the silicon nitride layers.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a novel method of a two-step etching process for forming fuse window openings on a semiconductor device which has a multiple number of inter-metal dielectric materials deposited on top such that the fuse window opening process can be easily controlled without over etching into a protective insulating layer deposited on top of the fuse. In the two-step etching process, a first etching process utilizing a first etchant which has low selectivity to a passivation layer consisting of a PE oxide and a PE nitride layer is first performed to remove the two layers, a second etching process utilizing a second etchant that has high selectivity to silicon nitride is then performed to etch away the inter-metal dielectric layers which stops at a silicon nitride etch-stop layer deposited on top of the insulating layer embedding the fuse. The novel etching process is suitable for the opening of fuse windows in any semiconductor device, but is particularly suitable for memory devices that has more than two metal conductor layers and consequently more than two inter-metal dielectric layers insulating the metal conductor layers deposited on top of the memory device.

Figure 1:
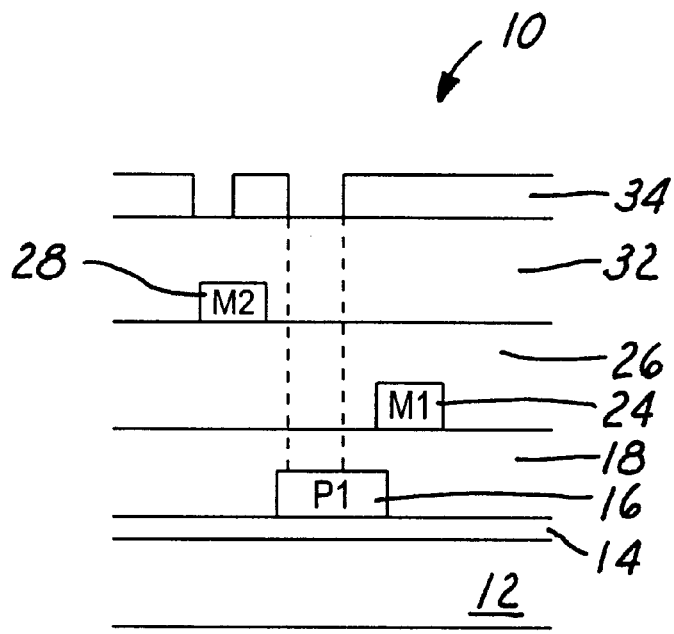
FIG. 1 is an enlarged, cross-sectional view of a conventional semiconductor device that has a fuse window opened by a single photoresist process.
Figure 2:
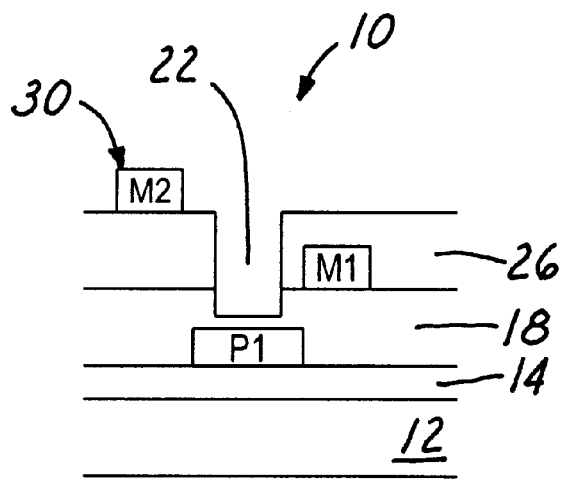
FIG. 2 is an enlarged, cross-sectional view of the semiconductor device of FIG. 1 after the opening of the fuse window.
Figure 3:
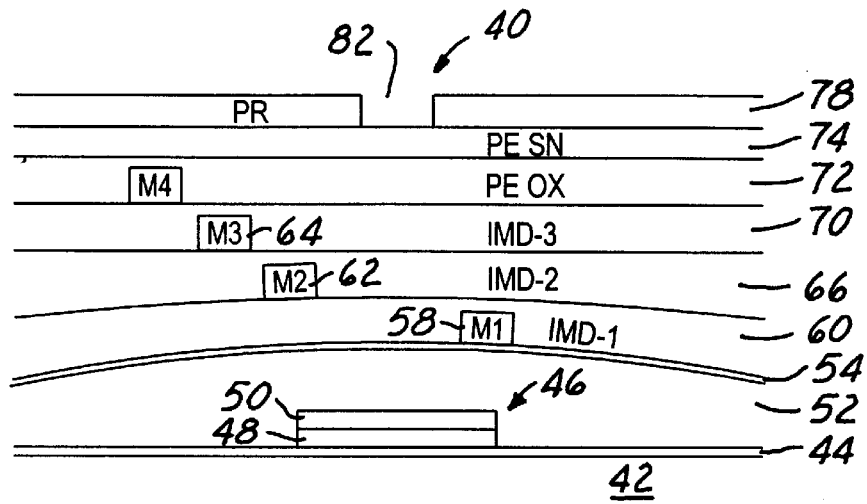
FIG. 3 is an enlarged, cross-sectional view of a present invention semiconductor device which has a photoresist layer deposited and patterned on top for the fuse window.

Referring now to FIG. 3, wherein a present invention semiconductor device 40 is shown. On a semiconducting substrate 42, an insulating layer 44 is first formed on top for insulating a polycide fuse 46. The polycide fuse 46 is constructed by a polysilicon layer 48 and a tungsten silicide layer 50. The fuse 46 can also be formed of a suitable metallic material such as aluminum, platinum silicide, titanium, tungsten, or other polycide materials such as titanium polycide and molybdenum polycide. The fuse 46 is typically formed of a thickness in the range between about 600 Å and about 6000 Å, a length in the range of between about 6 microns and 12 microns and a width in the range between about 1 micron and about 5 microns. The fuse can be suitably blown by the application of laser energy from a laser source such as Yumium-Yag or Neodymium-Yag at a wave length between about 1037 and about 1057 nanometers, at an energy of about 1~1.5 micro-joules and at a pause between about 30~50 nanoseconds.

The insulating layer 44 can be a silicon oxide layer, or a field oxide that is thermally grown in a wet or dry oxygen environment at 1 atm and a temperature of between about 650° C. to about 1250° C. A suitable thickness for the silicon oxide layer 44 can be between about 1000 Å and about 9000 Å, and preferably between about 4000 Å and about 6000 Å. The layer 44 insulates the fuse 46 from adjacent active devices and from the silicon substrate 42. Other suitable dielectric materials such as BPSG deposited by a plasma enhanced chemical vapor deposition (PECVD) technique can also be used to form the insulating layer 44 to approximately the same thickness as that of the silicon oxide.

An inter-layer dielectric (ILD) layer 52 is then deposited to a thickness of approximately 6,000 Å. The ILD layer can be suitably deposited of any insulating materials such as BPTEOS oxide which can be easily planarized at a reflow temperature of approximately 850°. After the ILD layer is planarized a thin layer, i.e., in the range between 100~500 Å and preferably between 200~300 Å of silicon nitride or any other suitable material as an etch-stop layer 54 is deposited on top of the ILD layer 52.

The ILD layer 52 can also be suitably formed of a material such as BPSG, phosphosilicate glass (PSG), silicon oxide or any other suitable dielectric material. When BPSG is used, it can be deposited by a precursor of tetraethoxysilicate (TEOS) in an atmospheric pressure chemical vapor deposition (APCVD) process. The BPSG material is preferably doped in-situ by boron or phosphorous during the formation of the dielectric layer 52. After deposition, the ILD layer 52 is annealed at a temperature of approximately 850° C. for 20~40 minutes in a planarization process for obtaining a smooth surface. The thickness of the ILD layer 52 after planarization is normally in the range between about 4000 Å and about 16000 Å, and preferably between about 5000 Å and about 7000 Å.

On top of the silicon nitride etch-stop layer 54, a metal conductor layer (not shown) is then deposited, patterned and formed into metal conductor 58. The first level metal conductor 58 can be formed of a suitable metallic material such as tungsten, molybdenum or aluminum to a thickness of between about 3000 Å and about 7000 Å, and a width of between about 1 micron and 3 microns. As a lower level metal conductor, it may be formed of tungsten for its thermal stability and processability. On top of the metal conductor 58, a first inter-metal dielectric layer (IMD-1) 60 is then deposited to insulate the first metal conductor 58. The material used to deposit the first IMD layer 60 can be TEOS oxide, BPTEOS oxide, LPTEOS oxide, PE oxide, SACVD oxide, or spin-on-glass.

In a similar manner, a second level and a third level metal conductors 62 and 64 are formed while insulated by a second IMD (IMD-2) layer 66 and a third IMD layer 70 (IMD-3), respectively. The second and the third IMD layers 66 and 70 can be formed of a similar material and by a similar process as that used in forming the first IMD layer 60. After the deposition of the third IMD layer 70, passivation layers of PE nitride 72 and PE oxide 74 are formed wherein the PE nitride layer 72 generally acts as a moisture barrier. Each of the IMD layers is planarized in a reflow process prior to the deposition of the next level metal conductor layers. The IMD layers 60, 66 and 70 can be annealed at a temperature of between 800~900° C. for approximately 30~45 minutes to achieve reflow and planarization. The thickness of the IMD layers deposited should be between about 4000 Å and about 16000 Å and preferably, between about 5000 Å and about 7000 Å.

Figure 4:
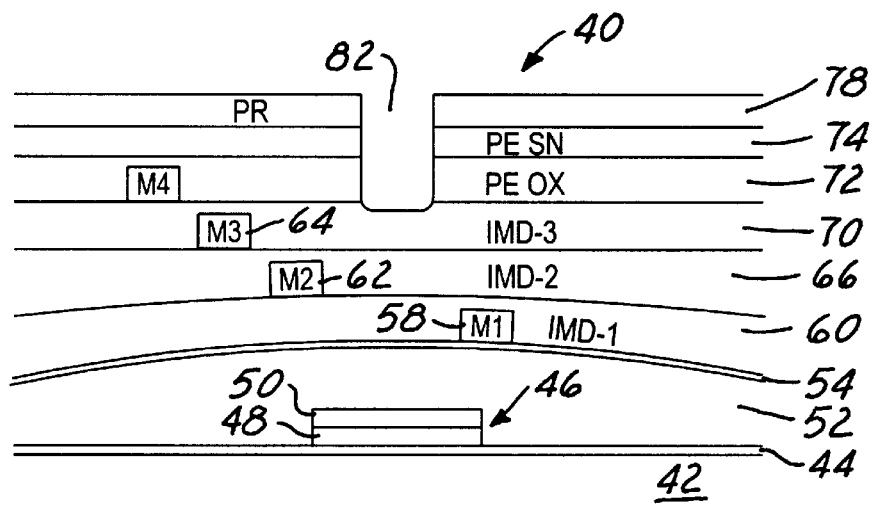
FIG. 4 is an enlarged, cross-sectional view of the semiconductor device shown in FIG. 3 after the fuse window is opened through the passivation layers of PE oxide and PE nitride.

After the planarization process for the passivation layer of PE oxide 74 is conducted, a photoresist layer 78 is deposited on top of the passivation layer 74. The photoresist layer 78 can be formed to a thickness of approximately 1 micron and then patterned by a masking process to expose the fuse opening 82. As shown in FIG. 4, a first step dry etching or reactive ion etching process is performed to etch away the passivation layers 72, 74 of PE nitride and PE oxide. This first etching process can be conducted in a LAM #4528 etch machine by using an etchant gas mixture of $CF_4/CHF_3/SF_6$. Any other suitable etchant gas for instance, any gas containing at least one gas selected from $CF_4$, $CHF_3$, $SF_6$, $O_2$, $SF_4$, $C_2F_6$ and $C_3F_8$ can be used for etching the passivation layers 72 and 74. The first etching process is completed in the LAM #4528 etch machine in an end-point mode by monitoring the nitride components. In the end-point detection mode, the presence of a reaction product or the absence of a reacting species can be monitored and used to determine when the etching process is complete. A widely used end-point detector is an optical emission spectrometer which uses a narrow bandpass filter and a photodiode to continuously monitor the intensity of wavelengths associated with the reaction product or reactive species. In the present case, when the intensity of the nitride spectra falls below a preset level is determined which indicates the end of the PE nitride etching process, the etching is stopped. It has been found that the time required to reach such end-point is approximately 40 seconds. The etching process is then continued to cause a 20~30% over-etch into the IMD-3 layer 70 to ensure the complete removal of PE oxide and PE nitride in the fuse opening 82.

Figure 5:
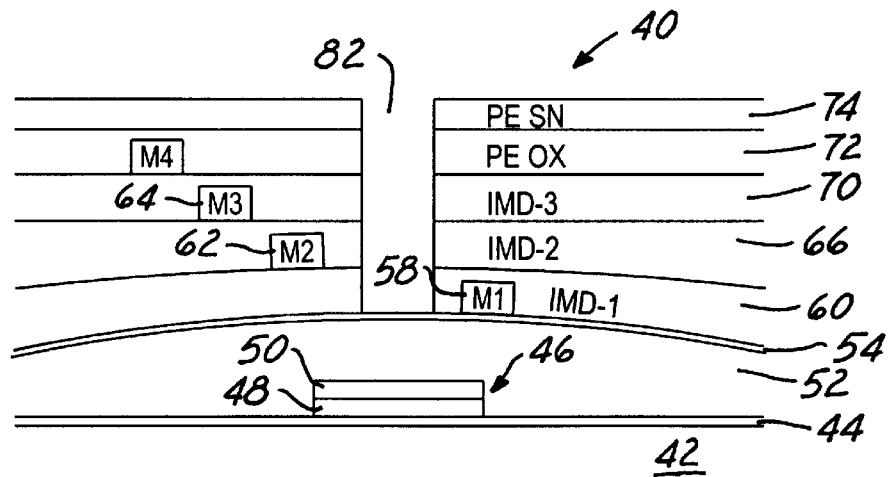
FIG. 5 is an enlarged, cross-sectional view of the present invention semiconductor device of FIG. 4 after a second etching step through the inter-metal dielectric layers exposing the fuse.

After the successful removal of the PE oxide and the PE nitride layers in the fuse opening 82, a second etching process is conducted to remove the IMD layers 70, 66 and 60. This is accomplished by utilizing a dry etching or reactive ion etching method and an etch chemistry which has a high selectivity to the silicon nitride etch stop layer 54. This is shown in FIG. 5. A suitable etchant was found to be $C_2F_6$ with the etch machine operated in a time mode for approximately 2~3 minutes. It has been found that the etchant gas of $C_2F_6$ has a selectivity ratio of oxide/nitride larger than 30. Any other suitable etchant gas may also be used as long as the etch selectivity of oxide/nitride is larger than 10. The etch stop layer 54 is used to control the thickness uniformity on top of the polyfuses. The deposited oxide thickness on the polyfuse may vary if we use local planarization scheme for the IMD layers 60, 66 and 70. In order to etch through such a thick oxide layer on top of the polyfuses, the etch uniformity is difficult to control. We therefore use the stop layer with high selectivity to oxide to ensure that the oxide thickness could be controlled within a certain range, and subsequently, the laser repair yield. For instance, when a first fuse has a thicker oxide on top than a fuse, a SiN layer is needed as a stop layer. When the first fuse is still etched to the oxide, the second fuse may be etched to the SiN layer until the first fuse is etched enough, then we change the etch recipe to etch through the SiN layer.

The dry etching process stops at the etch-stop layer 52 of silicon nitride such that the inter-layer dielectric layer 52 is not damaged to maintains its protection function for the fuse 46. This is an important aspect of the present invention in that the novel two-step etching process enables a precise control of the etching process. For instance, in the first etching step, the etchant gas has low selectivity for both PE oxide and PE nitride such that both passivation layers are removed quickly when exposed to a suitable etchant gas plasma. When the end-point is detected which detects the nitride component, the first etching step is stopped allowing only a small over-etching into the top IMD layer. The second etching process is then conducted utilizing an etchant gas which has low selectivity to the IMD material of oxide that forms IMD-1, IMD-2 and IMD-3. The etchant gas used in the second etching process has a high selectivity toward the silicon nitride etch-stop layer such that after all the oxide in the fuse opening 82 is consumed at a preset etch time (i.e., the etcher is operated in a time mode), the etch rate for the nitride layer 54 is so slow that it can be easily stopped. The present invention novel two-step etching process therefore is easily controllable and the quality and yield of the resulting fuse opening can be improved.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for etching fuse window openings through a passivation layer and at least two inter-metal dielectric (IMD) layers deposited on top of a fuse when the fuse is embedded in an insulating material including a top layer of silicon nitride on a semi-conducting substrate comprising the steps of etching an opening for said fuse window through the passivation layer in a first etching process by using a first etchant having low selectivity to the material forming the passivation layer, and etching said opening through said IMD layers in a second etching process by a second etchant having high selectivity to said layer of silicon nitride.

2. A method according to claim 1, wherein said passivation layer comprises a silicon nitride layer and a silicon oxide layer.

3. A method according to claim 1 further comprising the step of photomasking and patterning for said fuse window openings on said passivation layer.

4. A method according to claim 1, wherein said passivation layer comprises a plasma enhanced oxide layer and a plasma enhanced nitride layer.

5. A method according to clam 1, wherein said IMD layers are deposited of a material selected from the group consisting of TEOS oxide, BPTEOS oxide, PE oxide, LPTEOS oxide, SACVD oxide and spin-on-glass.

6. A method according to claim 1, wherein said first etchant consists of at least two gases selected from the group consisting of $CF_4$, $CHF_3$, $SF_6$, $O_2$, $SF_4$, $C_2F_6$ and $C_3F_8$.

7. A method according to claim 1, wherein said first etchant is a mixture of $CF_4$, $CHF_3$ and $SF_6$.

8. A method according to claim 1, wherein said first etchant is capable of etching a top PE oxide layer and a bottom PE nitride layer in said fuse window opening.

9. A method according to claim 1, wherein said first etching process is completed by an end-point mode and said second etching process is completed by a time mode.

10. A method according to claim 1, wherein said second etchant has an etch selectivity ratio for oxide/nitride greater than 10.

11. A method according to claim 1, wherein said second etchant is $C_2F_6$.

12. A method for form fuse window openings through inter-metal dielectric (IMD) layers deposited on top of a fuse comprising the steps of:

provinding a fuse on a semi-conducting substrate, depositing and planarizing an inter-layer dielectric (ILD) on top of said fuse, depositing a layer of silicon nitride on top of said ILD layer, forming at least two layers of metal conductors on top of said silicon nitride layer, each of said at least two metal conductor layers having a corresponding inter-metal dielectric (IMD) layer deposited on top, depositing a passivation layer having at least one insulating material on top of said IMD layers, etching an opening for said fuse window opening through said passivation layer in a first etching process utilizing a first etch chemistry having low selectivity to said at least one insulating material, and etching said opening through said IMD layers in a second etching process utilizing a second etch chemistry having high selectivity to silicon nitride, said second etching process stops at said layer of silicon nitride.

13. A method according to claim 12, wherein said passivation layer comprises a PE nitride layer and a PE oxide layer.

14. A method according to claim 12, wherein said first etch chemistry comprises at least one gas selected from the group consisting of $CF_4$, $CHF_3$, $SF_6$, $O_2$, $SF_4$, $C_2F_6$ and $C_3F_8$.

15. A method according to claim 12, wherein said second etch chemistry comprises a gas having an etch selectivity ratio for oxide/nitride larger than 10.

16. A method according to claim 12, wherein said IMD layers are deposited of a material selected from the group consisting of TEOS oxide, BPTEOS oxide, PE oxide, LPTEOS oxide, SACVD oxide and spin-on-glass.

17. A method according to claim 12 further comprising the step of removing said silicon nitride layer on top of said ILD layer in a third etching process.

18. An integrated circuit device comprising:

a fuse formed on a semi-conducting substrate, an inter-layer dielectric (ILD) layer insulating the fuse, a silicon nitride layer deposited on top of said ILD layer, at least two inter-metal dielectric (IMD) layers deposited on top of said silicon nitride layer, and a fuse window opened in said IMD layers exposing at least partially the fuse covered by said ILD and silicon nitride layers.

19. An integrated circuit device according to claim 18, wherein said IMD layer,, are deposited of a material selected from the group consisting of TEOS oxide, BPTEOS oxide, PE oxide, LPTEOS oxide, SACVD oxide and spin-on-glass.

20. An integrated circuit device according to claim 18, wherein said ILD layer is formed of BPTEOS oxide.

* * * * *